United States Patent [19]
Kato et al.

[11] Patent Number: 5,552,376
[45] Date of Patent: Sep. 3, 1996

[54] METHOD OF PREPARING BISMUTH OXIDE SUPERCONDUCTING WIRE

[75] Inventors: Takeshi Kato; Kenichi Sato, both of Osaka, Japan

[73] Assignees: Sumitomo Electric Industries, Ltd.; Director General of National Research Institute for Metals of Science and Technology Agency of Japan; Research Development Corporation of Japan, all of, Japan

[21] Appl. No.: 345,920

[22] Filed: Nov. 28, 1994

Related U.S. Application Data

[63] Continuation of Ser. No. 30,423, filed as PCT/JP92/00935 Jul. 22, 1992 published as WO93/02460 Feb. 4, 1993, abandoned.

[30] Foreign Application Priority Data

Jul. 24, 1991 [JP] Japan ................................ 3-184303

[51] Int. Cl.$^6$ .................................................. H01L 39/24
[52] U.S. Cl. .......................... 505/433; 29/599; 505/501
[58] Field of Search .................................. 505/430, 433, 505/500, 501; 29/599

[56] References Cited

U.S. PATENT DOCUMENTS 5,204,316  4/1993  Arendt et al. ....................... 29/599 X

FOREIGN PATENT DOCUMENTS 0496281  7/1992  European Pat. Off.

OTHER PUBLICATIONS

Journal of Metals, vol. 43, No. 3, Mar. 1991, P. 21–24, K. Sandhage et al. "Critical Issues in the Opit Processing of High–Jc BSCCO Superconductors" refer to full descriptions and all drawings.

Japanese Journal of Applied Physics, vol. 28, No. 1, Jan. 1989, P. L82–L84, T. Hikata et al. "AG–Sheathed Bi—Pb—Sr—Ca—Cu—O Superconducting Wires with High Critical Current Density" Refer to full descriptions and all drawings.

Journal of Applied Physics, vol. 66, No. 6, 15, Sep. 1989, P. 2762–2764, H. Sekine et al. "Fabrication of Bi—(Pb)—Sr—Ca—Cu—O Mono– and Multifilamentary Superconductors and Improvement in Critical Current Density" Refer to full descriptions and all drawings.

Applied Physics Letters, vol. 58, No. 19, 13, May 1991, P. 2159–2161, T. A. Miller et al. "Strain Tolerant Microfilamentary Conductors of Bi2Sr2Ca1Cu2O8—d" Refer to full description and all drawings.

Primary Examiner—Joseph M. Gorski
Attorney, Agent, or Firm—Pennie & Edmonds

[57] ABSTRACT

Powder having a composition in which the contents of Sr, Ca and Cu are increased so that an Sr-Ca-Cu-O phase is precipitated in addition to a 2223 phase of (Bi, Pb)-Sr-Ca-Cu is charged in a metal sheath, and this metal sheath is plastic-worked, then subjected to a primary heat treatment, then plastic-worked and further subjected to a secondary heat treatment. In the as-obtained bismuth oxide superconducting wire, pinning points based on the Sr-Ca-Cu-O phase are introduced into the superconductor, whereby magnetic field characteristic of the critical current density is improved.

8 Claims, 1 Drawing Sheet

METHOD OF PREPARING BISMUTH OXIDE SUPERCONDUCTING WIRE

This is a continuation, of application Ser. No. 08/030,423, filed as PCT/JP92/00935, Jul. 22, 1992 published as WO93/02460 Feb. 4, 1993, now abandoned.

TECHNICAL FIELD

The present invention relates to a method of preparing a bismuth oxide superconducting wire, and more particularly, it relates to a method of preparing a bismuth oxide superconducting wire which comprises the steps of charging a metal sheath with a bismuth oxide superconductor or a raw material therefor, then plastic-working this metal sheath into a wire and heat treating the same.

Background Art

It is known that a bismuth oxide superconductive material has a high critical temperature of about 110 K. It has been recognized that a high critical current density can be obtained by covering such a bismuth oxide superconductive material with a metal and plastic-working the same in this state into a thin tape and then heat treating this tape. It has also been recognized that the critical current density can be further increased by repeating the plastic working and the heat treatment a plurality of times, in particular.

It is known that bismuth oxide superconductors include that having a critical temperature of 110 K and those having critical temperatures of 80 K and 10 K. It is also known that non-superconducting phases partially appear particularly when a superconductor of a 110 K phase is to be prepared.

In relation to such bismuth oxide superconductors, it is further known that the aforementioned 110 K phase is provided by a 2223 phase containing Bi or (Bi, Pb), Sr, Ca and Cu in composition ratios of about 2:2:2:3, and the 80 K phase is provided by a 2212 phase containing such components in composition ratios of about 2:2:1:2.

In order to employ a bismuth oxide superconductor in a high magnetic field with a cooling medium of low-priced liquid nitrogen (77.3 K), therefore, it is necessary to generate pinning points in the largest possible amount while maximizing the content of the 2223 phase, being the 110 K phase.

DISCLOSURE OF THE INVENTION

Accordingly, an object of the present invention is to provide a method of preparing a bismuth oxide superconducting wire which can obtain a high critical current density and a high critical current in a high magnetic field.

Briefly stated, the present invention is adapted to employ a composition in which compositions capable of forming pinning points to be introduced are increased with respect to a composition being as close as possible to a 2223 phase being a 110 K phase for introducing the largest possible amount of non-superconducting phases exerting no bad influence on the 110 K phase while obtaining the 110 K phase, thereby supplying high pinning strength with the non-superconducting phases.

More specifically, the present invention is directed to a method of preparing a bismuth oxide superconducting wire which comprises the steps of charging powder of a bismuth oxide superconductor containing Bi, Pb, Sr, Ca and Cu or a raw material therefor in a metal sheath, plastic-working the said metal sheath being charged with the said powder into a wire, then performing a primary heat treatment, performing plastic working or pressing, and further performing a secondary heat treatment, and in order to solve the aforementioned technical problem, it comprises the following structure:

Namely, the present invention is characterized in that the powder to be charged is prepared from powder having a composition in which the contents of Sr, Ca and Cu are increased so that an Sr-Ca-Cu-O phase is finally precipitated in addition to a phase of $(Bi_{2.2-x}Pb_x)Sr_2Ca_2Cu_3$ (x =0.3 to 0.4).

The non-superconducting deposition phase is preferably composed of $(Ca_{0.8}, Sr_{0.2})_2CuO_3$, $(Ca_{0.5}, Sr_{0.5})CuO_2$ or $(Ca_{0.5}, Sr_{0.5})_3Cu_5O_8$, and the best composition may be $(Ca_{0.8}, Sr_{0.2})_2CuO_3$, as described in the following Example.

It is preferable that the total time of the primary and secondary heat treatments is 100 to 300 hours and the powder which is charged in the metal sheath is not more than 2.0 μm in maximum particle diameter and not more than 1.0 μm in mean particle diameter.

The bismuth oxide superconductor or the raw material therefor employed in the present invention is generally a polycrystalline substance, which is made of an aggregate of superconducting and non-superconducting phases.

Further, the material for the metal sheath employed in the present invention is preferably prepared from a metal or an alloy which is non-reactive with the bismuth oxide superconductor and of low electrical resistance, such as silver or a silver alloy, for example.

The charged powder employed in the present invention generates 110 K phases by the heat treatments, and disperses non-superconducting phases, mainly Ca-Sr-Cu-O phases, among the 110 K phases, to make these phases serve as pinning points.

In order to obtain a high critical current density under the liquid nitrogen temperature (77 K) in a high magnetic field, it is necessary to introduce pinning points into the superconductor. However, it is relatively difficult to generate a Bi-based high-temperature phase which is composed of five elements (excluding oxygen), and hence it is extremely difficult to add elements other than the five elements in consideration of reactivity of the five elements and generation of a high-temperature phase. Thus, it is difficult to introduce pinning points with elements other than the five elements.

While it is known at present that foreign phases inevitably remain when a Bi-based high-temperature phase to be is prepared, the feature of the present invention resides in an attempt to positively make the same serve as pinning points. As to the residual foreign phases, a Bi superconductor which is composed of five elements contains various types of such foreign phases, while the inventors have independently investigated the compositions of such foreign phases, to find that the compositions are $(Ca_{0.8}, Sr_{0.2})_2CuO_3$, $(Ca_{0.5}, Sr_{0.5})CuO_2$ and $(Ca_{0.5}, Sr_{0.5})_3Cu_5O_8$.

Therefore, it is possible to introduce pinning points which are non-reactive with the high-temperature phase, by increasing the compositions by these foreign phases.

Thus, a wire into which pinning points are introduced is improved in critical current density in a high magnetic field. However, this effect is small if the amount of the pinning points is small, while the path for the superconducting current is reduced if the amount is too large, to lower the superconducting current on the contrary.

BEST MODE FOR CARRYING OUT THE INVENTION

Figure 1:
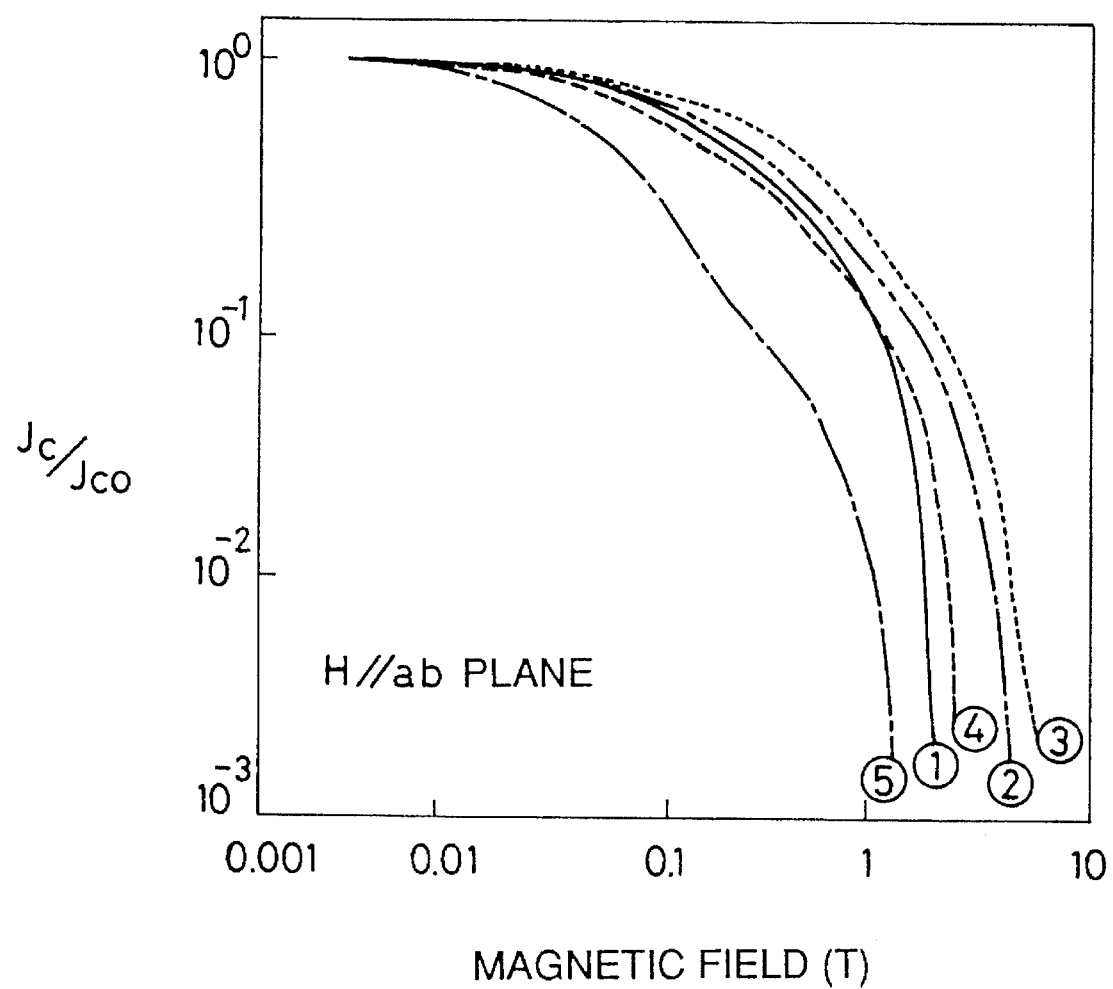
FIG. 1 illustrates magnetic field characteristics of critical current densities of respective wires obtained by Experimental Example carried out according to the present invention.

Respective powder materials of $Bi_2O_3$, PbO, $SrCO_3$, $CaCO_3$ and CuO were weighed and mixed with each other to have composition ratios shown in Table 1.

TABLE 1

|   | Bi | Pb | Sr | Ca | Cu |
|---|---|---|---|---|---|
| 1 (Y = 0) | 1.8 | 0.4 | 2.0 | 2.0 | 3.0 |
| 2 (Y = 0.2) | 1.8 | 0.4 | 2.08 | 2.32 | 3.2 |
| 3 (Y = 0.5) | 1.8 | 0.4 | 2.2 | 2.8 | 3.5 |
| 4 (Y = 1.0) | 1.8 | 0.4 | 2.4 | 3.5 | 4.0 |
| 5 (Y = 1.2) | 1.8 | 0.4 | 2.48 | 3.92 | 4.2 |

Referring to the above Table, the sample 1 contained Bi, Pb, Sr, Ca and Cu in ratios of 1.8:0.4:2.0:2.0:3.0, while Sr, Ca and Cu were added to the composition of the sample 1 in composition ratios of 0.4Y:1.6Y:1.0Y in the samples 2 to 5 to leave prescribed amounts of $(Ca_{0.8}, Sr_{0.2})_2CuO_3$.

Then, the aforementioned mixed powder materials were heat treated at 800° C. for 20 hours, thereafter pulverized, and then heat treated at 860° C. for 2 hours, to obtain powder materials for charging. These powder materials were pulverized to be 2.0 μm in maximum particle diameter and 1.0 μm in mean particle diameter.

The as-obtained powder materials were charged in silver pipes of 6.0 mm in outer diameter and 4.0 mm in inner diameter, which in turn were wire-drawn into diameters of 1.0 mm, then rolled into thicknesses of 0.17 mm, and further pressed. Thereafter the samples were heat treated at 845° C. for 150 hours as primary heat treatments respectively, thereafter again pressed, and then heat treated at 840° C. for 50 hours as secondary heat treatments.

As to the wires obtained in the aforementioned manner, magnetic field dependencies of critical current densities were measured under a temperature of 77.3 K. respectively.

As the result, Jc-B characteristics shown in FIG. 1 were obtained. Referring to FIG. 1, the axis of abscissas shows applied magnetic fields, and the axis of ordinates shows measured values of Jc standardized with Jco in zero magnetic fields.

It is understood from FIG. 1 that the magnetic field characteristic of the critical current density can be improved by applying such composition ratios that $(Ca_{0.8}, Sr_{0.2})_2CuO_3$ is precipitated in addition to the 2223 phase as the powder to be charged. More specifically, the samples 2 and 3 exhibit particularly excellent characteristics, while the sample 4 exhibits a slightly improved characteristic. When the amount of $(Ca_{0.8}, Sr_{0.2})_2CuO_3$ is too large as in the sample 5, the magnetic field characteristic of the critical current density is rather reduced as compared with the sample 1 to which absolutely no such elements were added.

We claim:

1. A method of preparing a bismuth oxide superconducting wire comprising the steps of adding an amount of Sr, Ca, and Cu sufficient to form a non-superconducting Sr-Ca-Cu-O phase to a bismuth oxide superconductor powder of Bi, Pb, Sr, Ca, and Cu or a raw material therefore to form a $(Bi_{2.2-x}, Pb_x)Sr_2Ca_2Cu_3$ (x = 0.3 to 0.4) superconducting phase, wherein said amount of Sr, Ca, and Cu is in a composition ratio of 0.4Y:1.6Y:1.0Y with Y in a range of 0.2 to 1.0;

charging said bismuth oxide superconductor powder or a raw material therefor in a metal sheath;

plastically-working said metal sheath being charged with said powder into a wire;

performing a first heat treatment on said wire;

performing a plastic working step or pressing on said wire; and performing a second heat treatment on said wire such that the $(Bi_{2.2-x}, Pb_x)Sr_2Ca_2Cu_3$ superconducting phase and the non-superconducting Sr-Ca-Cu-O phase are formed by said heat treatment steps, wherein said non-superconducting Sr-Ca-Cu-O phase acts as a pinning point in said bismuth oxide superconducting wire.

2. The method of preparing a bismuth oxide superconducting wire in accordance with claim 1, wherein said Sr-Ca-Cu-O phase contains $(Ca_{0.8}, Sr_{0.2})_2CuO_3$.

3. The method of preparing a bismuth oxide superconducting wire in accordance with claim 1, wherein said powder to be charged is not more than 2.0 μm in maximum particle diameter and not more than 1.0 μm in mean particle diameter.

4. The method of preparing a bismuth oxide superconducting wire in accordance with claim 1, wherein said metal sheath is made of silver or a silver alloy.

5. A method of preparing a bismuth oxide superconducting wire comprising the steps of adding an amount of Sr, Ca, and Cu sufficient to form a non-superconducting Sr-Ca-Cu-O phase to a bismuth oxide superconductor powder of Bi, Pb, Sr, Ca, and Cu or a raw material therefor to form a $(Bi_{2.2-x}, Pb_x)Sr_2Ca_2Cu_3$ (x = 0.3 to 0.4) superconducting phase, wherein said non-superconducting Sr-Ca-Cu-O phase contains at least one composition selected from a group of $(Ca_{0.8}, Sr_{0.2})_2CuO_3$, $(Ca_{0.5}, Sr_{0.5})CuO_2$ and $(Ca_{0.5}, Sr_{0.5})_3Cu_5O_8$;

charging said bismuth oxide superconductor powder or a raw material therefor in a metal sheath;

plastically-working said metal sheath being charged with said powder into a wire;

performing a first heat treatment on said wire;

performing a plastic working step or pressing on said wire; and performing a second heat treatment on said wire such that the $(Bi_{2.2-x}, Pb_x)Sr_2Ca_2Cu_3$ superconducting phase and the non-superconducting Sr-Ca-Cu-O phase are formed by said heat treatment steps, wherein said non-superconducting Sr-Ca-Cu-O phase acts as a pinning point in said bismuth oxide superconducting wire.

6. The method of preparing a bismuth oxide superconducting wire in accordance with claim 5, wherein said Sr-Ca-Cu-O phase contains $(Ca_{0.8}, Sr_{0.2})_2CuO_3$.

7. The method of preparing a bismuth oxide superconducting wire in accordance with claim 5, wherein said powder to be charged is not more than 2.0 μm in maximum particle diameter and not more than 1.0 μm in mean particle diameter.

8. The method of preparing a bismuth oxide superconducting wire in accordance with claim 5, wherein said metal sheath is made of silver or a silver alloy.

* * * * *